US008557707B2

(12) United States Patent
Hayat et al.

(10) Patent No.: US 8,557,707 B2
(45) Date of Patent: Oct. 15, 2013

(54) FOCUSED ION BEAM DEEP NANO-PATTERNING APPARATUS AND METHOD

(75) Inventors: Alex Hayat, Karmiel (IL); Alex Lahav, Haifa (IL); Meir Orenstein, Haifa (IL)

(73) Assignee: Technion Research and Development Foundation Ltd., Haifa (IL)

( * ) Notice: Subject to any disclaimer, the term of this patent is extended or adjusted under 35 U.S.C. 154(b) by 306 days.

(21) Appl. No.: 12/598,228

(22) PCT Filed: Apr. 27, 2008

(86) PCT No.: PCT/IL2008/000558
§ 371 (c)(1),
(2), (4) Date: Jun. 30, 2010

(87) PCT Pub. No.: WO2008/132734
PCT Pub. Date: Nov. 6, 2008

(65) Prior Publication Data
US 2010/0267234 A1    Oct. 21, 2010

Related U.S. Application Data

(60) Provisional application No. 60/924,070, filed on Apr. 30, 2007.

(51) Int. Cl.
H01L 21/3065    (2006.01)
(52) U.S. Cl.
USPC ........... 438/700; 438/702; 438/712; 438/947; 257/E21.218; 977/773; 977/888; 977/901
(58) Field of Classification Search
USPC .......... 438/712, 947, 700, 702; 977/888, 773, 977/856, 901; 257/E21.218
See application file for complete search history.

(56) References Cited

U.S. PATENT DOCUMENTS

2005/0285275 A1    12/2005    Son et al.
2006/0191767 A1     8/2006    Hassler et al.
2006/0243919 A1    11/2006    Zhang et al.

FOREIGN PATENT DOCUMENTS

JP    01042822 A  *  2/1989
JP    02146730 A  *  6/1990
JP    2007-123450 A  *  5/2007

OTHER PUBLICATIONS

Young R J et al: "Gas-assisted focused ion beam etching for microfabrication and inspection" Microelectronic Engineering, Elsevie Publishers BV., Amsterdam, NL, vol. 11, No. 1-4, Apr. 1, 1990, pp. 409-412.

(Continued)

Primary Examiner — Mary Wilczewski
Assistant Examiner — Toniae Thomas
(74) Attorney, Agent, or Firm — Browdy and Neimark, PLLC

(57) ABSTRACT

The present invention introduces a new technique allowing the fabrication of high-aspect ratio nanoscale semiconductor structures and local device modifications using FIB technology. The unwanted semiconductor sputtering in the beam tail region prevented by a thin slow-sputter-rate layer which responds much slower and mostly to the high-intensity ion beam center, thus acting as a saturated absorber funnel-like mask for the semiconductor. The protective layer can be deposited locally using FIB, thus enabling this technique for local device modifications, which is impossible using existing technology. Furthermore, such protective layers allow much higher resolution and nanoscale milling can be achieved with very high aspect ratios, e.g. Ti layer results in aspect ratio higher than 10 versus bare semiconductor milling ratio of about 3.

18 Claims, 6 Drawing Sheets

(56) References Cited

OTHER PUBLICATIONS

Young R. J. et al.: "Characteristics of 1-19 gas-assisted focused ion beam etching" Journal of Vacuum Science and Tecnology—B, vol. 11, No. 2, Mar. 1993'-Apr. 1993 pp. 234-241.

Overwijk M H F et al: "High-Quality Focused-Ion-Beam-Made Mirrors for INGAP/INGAALP Visible-Laser Diodes" Journal of Applied Physics, American Institute of Physics. New York, US, vol. 74, No. 12, Dec. 15, 1993, pp. 7048-7053.

Kim Y. K. et al.: "Focused ion beam nanopatterning for optoelectronic device fabrication" IEEE Journal of Selected Topics in Quantum Electronics, vol. 11, No. 6, Nov. 2005-Dec. 2005 pp. 1292-1298.

* cited by examiner

FOCUSED ION BEAM DEEP NANO-PATTERNING APPARATUS AND METHOD

FIELD OF THE INVENTION

The present invention relates to an apparatus and method for high aspect-ratio Focused Ion Beam semiconductor nano-patterning wherein undesired semiconductor material decomposition by the beam-tail ions is prevented by a protective Ti layer acting as a mask for the semiconductor.

BACKGROUND OF THE INVENTION

Focused ion beam (FIB) etching has been widely used as a versatile maskless lithography technique in numerous fields. Nano-patterning using FIB etching is generally employed in order to develop or locally modify devices, including integrated circuits, micro-systems and micro-photonics. Due to the ability of FIB patterning to save time and process steps, it can be exploited to develop prototypes of both electrical and optical devices: Many photonic and optoelectronic devices employ sub-wavelength-scale structures, such as diffraction gratings, Distributed Bragg reflectors (DBRs), photonic crystals, and surface plasmon devices.

In semiconductors commonly used in microelectronics and integrated photonics, high aspect ratio nanoscale milling cannot be achieved due to the material decomposition (see FIG. 1a and explanation hereinafter) caused by the beam-tail ion local energy injection and thus deep FIB milling in semiconductors was reported only for large feature sizes of more than 0.15 µm. The aspect ratios achieved for bare semiconductor material nanoscale milling is usually lower than 3.

Such low aspect ratio semiconductor milling may cause unwanted metal cuts or short circuits in microelectronics FIB circuit editing (see FIG. 2(a)).

In photonic devices with features as small as few tens of nanometers needed for short-wavelength (visible and UV) applications such low aspect ratios prevent the fabrication of efficient periodic structures.

In methods of microelectronics circuit editing by FIB milling known in the art, the low aspect ratio problem is usually prevented by a Design for Testing (DFT) methodology in which the designer determines in advance the critical signals to be potentially edited by FIB. However, this method wastes time and crucial chip area and, only the predetermined signals can be accessed.

In micro-photonics, alternative multi-step electron-beam lithography followed by chemical etching techniques must be used instead of FIB for nano-scale features which take up much more time and resources.

U.S. Pat. No. 5,580,419; entitled "Process of making semiconductor device using focused, ion beam for resistless in situ etching, deposition, and nucleation"; to Berenz, John J.; disclose a method for producing ultra dense and ultra fast integrated circuits utilizing an advanced ion beam processing system.

U.S. Pat. No. 5,043,290; entitled "Process for forming electrodes for semiconductor devices by focused ion beam technology"; to Nishioka, Tadashi; et at.; discloses a method for forming an insulator-covered electrode on semiconductor substrate by forming a conductor layer on insulation film, exposing part of substrate, and forming terminal connection electrode.

U.S. Pat. No. 6,297,503; entitled "Method of detecting semiconductor defects"; to Bindell, Jeffrey B.; et at.; discloses a defects detection method for semiconductor devices, involving scanning thin layer specimen surface with electron beam using scanning electron microscope, with lateral resolution of about electron beam size.

U.S. Pat. No. 6,252,228; entitled "Method of analyzing morphology of bulk defect and surface defect on semiconductor wafer"; to Cho, Sung-hoon; et at.; discloses a bulk defect analysis method for semiconductor wafer, involving analyzing bulk defect in wafer using specimen which is manufactured by milling wafer by preset marker formed at position near bulk defect existence area.

U.S. Pat. No. 6,545,490; entitled "Trench-filled probe point for a semiconductor device"; to Bruce, Victoria J.; discloses a semiconductor package manufacturing and testing method e.g. for flip-chip circuit package, involving filling conductive material in trench that is formed in back side of package, in order to provide probe point.

SUMMARY OF THE INVENTION

The present invention discloses a high aspect ratio semiconductor nano-patterning technique by focused ion beam. The undesired semiconductor material decomposition by the lower intensity ion beam tail is prevented by a slow-sputter-rate layer forming a funnel and acting effectively as a mask over the semiconductor. The protective layer may be deposited locally allowing nano-scale sputtering with features as smaller than 30 nm and deeper than 350 nm corresponding to aspect ratio higher than 10.

The process according to the present invention enables higher aspect ratios for much smaller feature sizes (typically less than 30 nm).

This presents a great advantage for fabrication of short-wavelength photonic periodic structures with no need for electron-beam lithography followed by chemical etching and mask production.

Additionally, the method presents a great advantage for GaAs, GaAlAs, or silicon (or any other semiconductor) microelectronic debug and repair in VLSI at a single device level. Using this high aspect-ratio nano-scale FIB milling method of circuit editing can be performed practically on any signal in microelectronics, unlike in existing DFT methodology, and design time and resources can be saved.

The present invention introduces a new technique allowing the fabrication of high-aspect ratio nano-scale semiconductor structures and local device modifications using FIB technology. The FIB profile is Gaussian with long tails, and thus usually the etched profile has round edges limiting the milling aspect ratio. When a protective layer is used on top of the semiconductor, the beam tails are absorbed by the slowly milled protective layer allowing only the high-intensity beam center to reach the semiconductor surface. Various materials may be used to serve as a protective layer, and in our experiment Ti was chosen due to its good adhesion properties and very slow sputtering rates after oxidation, which occurs immediately after Ti is deposited.

According to an exemplary embodiment of the invention, a method of focused ion beam deep nano-patterning is provided comprising the steps of: depositing a protective layer over a semiconductor substrate; and creating a deep nano-pattern in said substrate by directing a focused ion beam onto said protective layer, wherein sputtering rate by a focused ion beam said of said protective layer is slower than said substrate.

In some embodiments the protective layer is deposited over a portion of said substrate.

In some embodiments the protective layer is deposited over a portion of said substrate using ion beam deposition.

In some embodiments the method further comprises the step of removal of said protective layer after the step of creating a deep nano-pattern.

In some embodiments the method further comprises further comprising oxidation of said protective layer before the step of creating a deep nano-pattern.

In some embodiments the substrate is selected from a group comprising: GaAs, GaAlAs, Si, GaP, GaInP, and Ge.

In some embodiments the method further comprises protective layer is selected from a group comprising: Titanium and Titanium Oxide.

In some embodiments the method further comprises substrate is a VLSI electronic circuit.

In some embodiments the method further comprises step of creating a deep nano-pattern in said substrate comprising creating an electric discontinuity in an electronic structure within said VLSI.

In some embodiments the method further comprises depositing conductive material in said created deep nano-pattern.

In some embodiments the step of depositing conductive material in said created deep nano-pattern comprises creating a new electronic connection between two electronic structures within said VLSI.

In some embodiments the step of depositing conductive material in said created deep nano-pattern comprises creating electric connection between an electronic structure within said VLSI and a test pad on the surface of said substrate.

In some embodiments the aspect ratio of said created deep nano-pattern in said substrate is larger than 5.

In some embodiments the aspect ratio of said created deep nano-pattern in said substrate is larger than 8.

In some embodiments the aspect ratio of said created deep nano-pattern in said substrate is larger than 2 and the width of said created deep nano-pattern is smaller than 100 nanometers.

In some embodiments the aspect ratio of said created deep nano-pattern in said substrate is larger than 2 and the width of said created deep nano-pattern is smaller than 50 nanometers.

In some embodiments the created deep nano-pattern is a repetitive pattern.

In some embodiments the repetitive pattern is selected from a group comprising: diffraction gratings, Distributed Bragg reflectors, photonic crystals, and surface plasmon devices.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

Figure 1A:
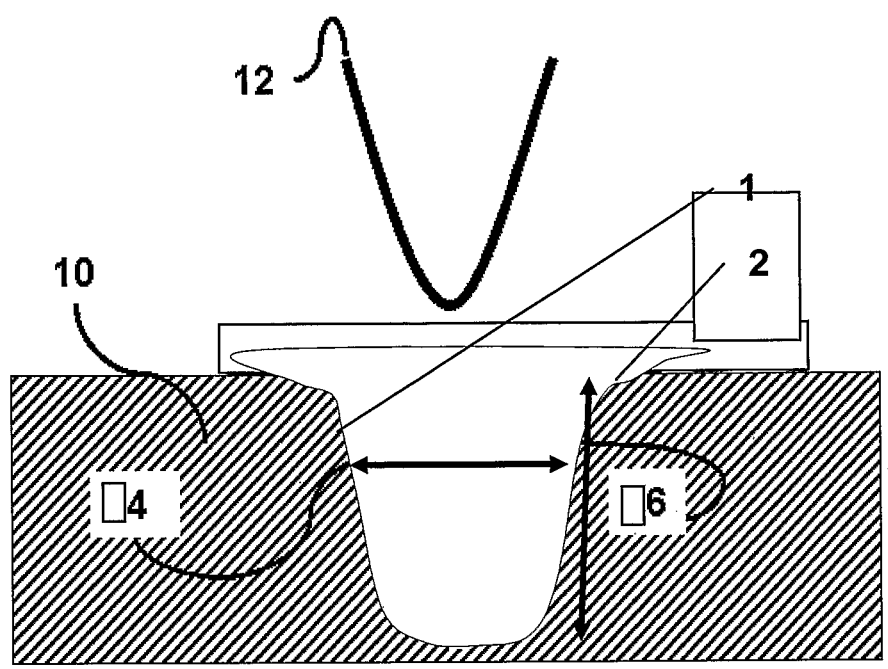
FIG. 1(a) schematically depicts a bare semiconductor FIB milling profile with low aspect ratio produced as known in the art.

The present invention relates to an apparatus and method for high aspect-ratio Focused Ion Beam semiconductor nano-patterning wherein undesired semiconductor material decomposition by the beam-tail ions is prevented by a protective Ti layer acting as a mask for the semiconductor.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The drawings are generally not to scale. For clarity, non-essential elements were omitted from some of the drawings.

As used herein, an element or step recited in the singular and proceeded with the word "a" or "an" should be understood as not excluding plural elements or steps, unless such exclusion is explicitly recited.

FIG. 1(a) schematically depicts a bare semiconductor FIB milling profile with low aspect ratio produced as known in the art.

The ion beam density profile is schematically depicted by the "Gaussian-like" curve 12. When a beam with such a profile interacts with a bare semiconductor sample 10, a wide trench 1 having depth 6 and width 4 is created by semiconductor sputtering. Generally, the edges of the trench are rounded. The low intensity wings of the ion beam limits the aspect ratio of such trenches, defined as depth 6 over width 4 to no more than 3.5.

Additionally, the sample surface near the edges 2 of the trench suffers damage due to ion bombardment.

Figure 1B:
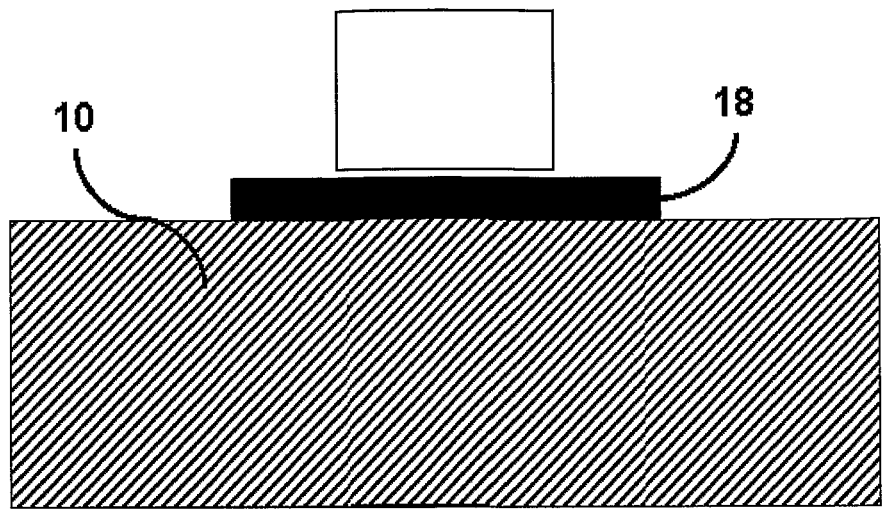
FIGS. 1(b) and 1(c) schematically depicts a high aspect ratio FIB milling profile produced using a slow-sputter rate protective layer forming a funnel-like mask according to the method of the current invention.
Figure 1C:
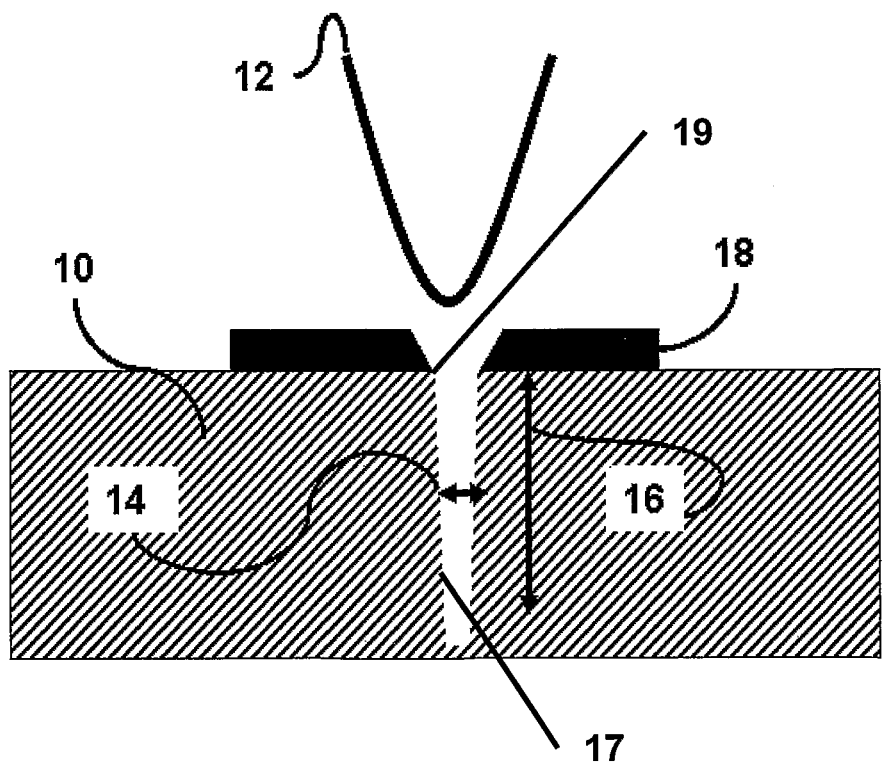

FIGS. 1(b) and 1(c) schematically depicts a high aspect ratio FIB milling profile produced using a sloe-sputter rate protective layer forming a funnel-like mask according to the method of the current invention.

FIG. 1(b) shows a patch 18 of material having slower sputtering rate than the semiconductor, deposited over the sample 10. The protective layer may be deposited locally for example using FIB. Additionally or alternatively, other deposition methods may be used as known in the art. Optionally, plurality of patches, large areas of the sample or the entire sample area may be coated with protective layer.

Protective layer preferably comprises material with sputtering rate lower than the semiconductor sample. For example Titanium (Ti) may be used. However, other materials may be used. Optionally, protective layer comprises compound material deposited simultaneously or reactively created on the surface such as metal oxide created by exposing the deposited layer to Oxygen or depositing the metal in presence of oxygen, etc.

FIG. 1(c) schematically depicts a high aspect ratio FIB milling profile produced using a slow-sputter rate protective layer forming a funnel-like mask according to the method of the current invention.

The ion beam density profile is schematically depicted by the "Gaussian-like" curve 12.

When a beam with such a profile interacts with a the protective layer 18 on top of semiconductor sample 10 it is slowly digs into the protective layer until a small opening 19 is made in the protective layer 18.

Due to the relative higher sputtering rate of the semiconductor sample 10 in respect to the protective layer 18, a trench 17 is created in the sample 10 having depth 16 and width 14.

A wide trench 1 having depth 6 and width 4 is created by semiconductor sputtering. Generally, the edges of the trench are rounded. The low intensity wings of the ion beam are blocked by the protective layer and thus the aspect ratio of such trenches, defined as depth 16 over width 14 may be high.

Additionally, the sample surface near the edges of the trench 17 is protected from damage due to ion bombardment.

In contrast to lithography, wherein a mask having a small opening has to be placed (or created by an electron beam) over the exact location of the intended trench, the small hole 19 in the protective layer 18 is naturally created during the FIB milling process. Moreover, the entire process may optionally be done in the same FIB system wherein both protective layer 18 and the milling process are done using FIB technology.

Figure 2A:
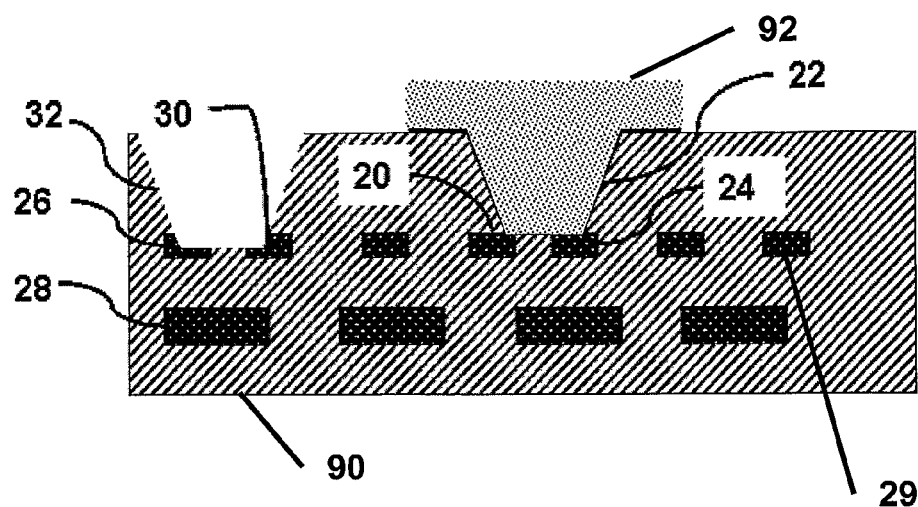
FIG. 2(a) schematically depicts problems in microelectronic FIB circuit editing caused by low aspect ratio trench created by methods of the art.

FIG. 2(a) schematically depicts problems in microelectronic FIB circuit editing caused by low aspect ratio trench created by methods of the art.

In the process of designing, testing and editing of complex integrated circuits (IC), is necessary sometimes to modify the electronic circuitry already produced on a semiconductor substrate 90. The electronic circuitry is generally comprises of features (e.g. 28, 29) at various depth within and on the surface of the substrate 90.

While accessing or modifying features on the surface is relatively easy, accessing features buried under the surface or deep within the substrate necessitates creating a trench reaching said features. Usually, it is necessary to achieve a certain depth to reach any metals in VLSI. Editing may comprise one or combination of: cutting a feature such as a conductor to electrically separate one section of the circuit from another; electrically connecting two features by creating a new conductor joining them; and creating a test point by creating a conduction route between a feature and a patch on the surface. Optionally, electrically connecting two features requires accessing one or both with a created trench than depositing conducting material in the created trench.

It is easy to see that the ability to create deep and narrow trenches is highly advantageous for such editing and testing process.

For example, wide trench 32 created by FID methods of the art is not capable of cutting and dividing a narrow feature 26. In fact, it may be impossible to access a small feature 26 without damaging a nearby feature 30.

Similarly, it may be impossible to access deep feature 28 without damaging features 26 and/or 30.

Similarly, a test patch 32, design to allow electrical probing of feature 24 may undesirably create a short between feature 24 and nearby feature 20.

Figure 2B:
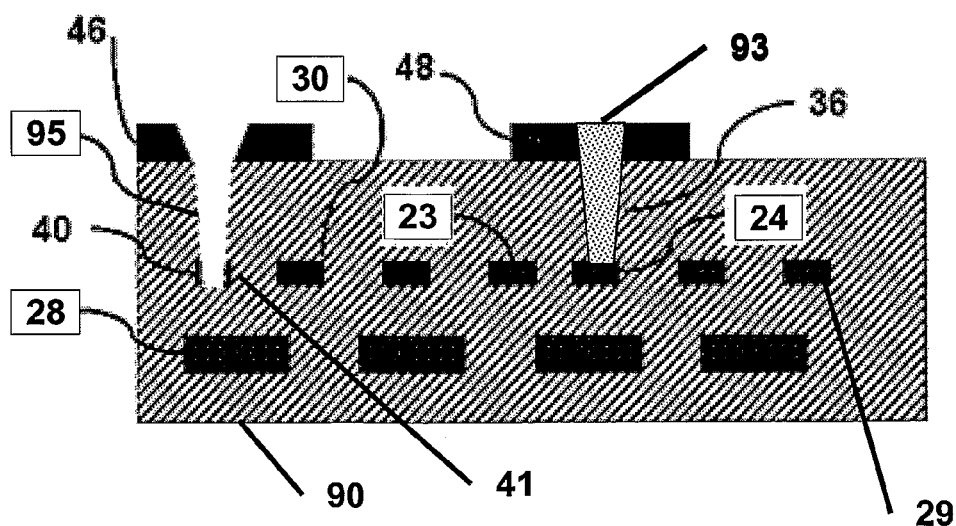
FIG. 2(b) schematically depicts local protective layer assisted high-aspect ratio FIB milling for circuit editing according to the method of the current invention.

FIG. 2(b) schematically depicts local protective layer assisted high-aspect ratio FIB milling for circuit editing according to the method of the current invention.

In contrast to the method of the art, by deposing a protective layer 46 above feature 26, it is possible to create by FIB milling a deep and narrow trench 95, dividing said feature to electrically separated parts 40 and 41 without damaging nearby feature 30. Similarly, it is possible to completely eliminate feature 26 by FIB milling a deep and narrow trench without damaging nearby feature 30.

In another example, an access patch may be created by: depositing protective patch 48 over feature 24; FIB milling a deep and narrow trench 36; and deposing conductive material 93 into trench 36. In contrast to the FIB method of the art, the method according to the current invention allows creating a test point to feature 24 without creating a short to nearby feature 23.

Similarly, it may be possible to make an access trench reaching deep feature 28 by milling a high aspect ration trench between (and without contacting) features 26 and 30.

Thus this technique according to the current invention enables local device modifications, which is impossible using existing technology. Furthermore, such protective layers allow much higher resolution and nano-scale milling can be achieved with very high aspect ratios. For example Ti layer results in aspect ratio higher than 10 versus bare semiconductor milling ratio of about 3. The sputtering rate selectivity between the semiconductor and the slow-sputter-rate protective layers determines the minimal feature size of the created dynamic mask.

Moreover, it could provide the essential solution for silicon debug and repair considering the continued shrinking of device dimensions in Si VLSI enabling circuit probing at a single device level.

Thickness and type of protective layer may be modified according to the desired required aspect ratio wherein thicker and or harder protective layer may result in higher aspect ration than thin and/or softer layer.

Figure 3:
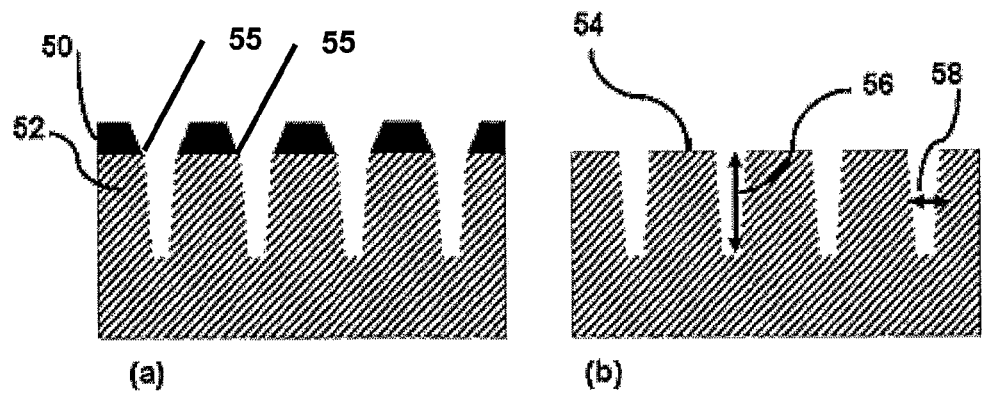
FIG. 3(a) schematically depicts periodic structure fabrication using FIB milling with protective layer according to the method of the current invention.
FIG. 3(b) schematically depicts final structure after the protective layer is removed of periodic structure fabrication using FIB milling with protective layer according to the method of the current invention.

FIG. 3(a) schematically depicts periodic structure fabrication using FIB milling with protective layer according to the method of the current invention.

According to an exemplary embodiment of the current invention, a protective layer 50 is deposited on the surface 54 of substrate 52. Than, a plurality of high aspect ration trenches 55 are FIB milled into the structure, penetrating protective layer 50 and creating trenches 55 having depth 56 and width 58.

FIG. 3(b) schematically depicts final structure after the protective layer is removed of periodic structure fabrication using FIB milling with protective layer according to the method of the current invention.

The demonstrated a high-aspect ratio FIB milling technique presents a generic method for deep nano-patterning in semiconductors. A protective layer may significantly improve the material patterning resolution, allowing very high aspect ratio features. This method may be employed in order to generate nano-scale sub-wavelength-feature photonic structures such as DBRs and gratings for the developing field of short-wavelength photonics.

The following figures present experimental results verifying the advantages of the current invention.

Figure 4:
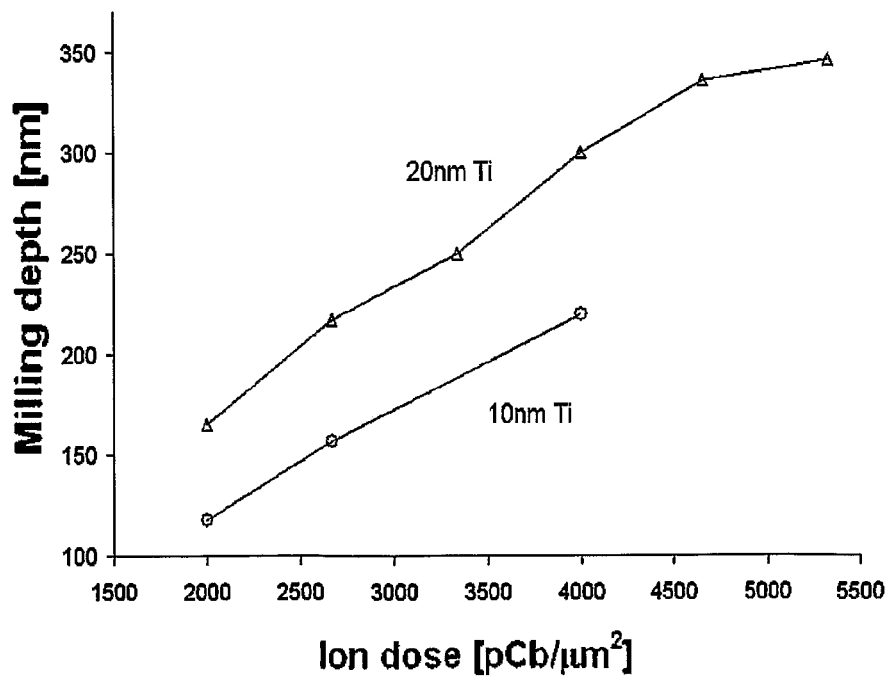
FIG. 4 schematically depicts experimental results of milling depth versus ion dose for (◯)-10 nm Ti-coated semiconductor and (△)-20 nm Ti-coated semiconductor.

FIG. 4 schematically depicts experimental results of milling depth versus ion dose for (◯)-10 nm Ti-coated semiconductor and (Δ)-20 nm Ti-coated semiconductor.

Figure 5A:
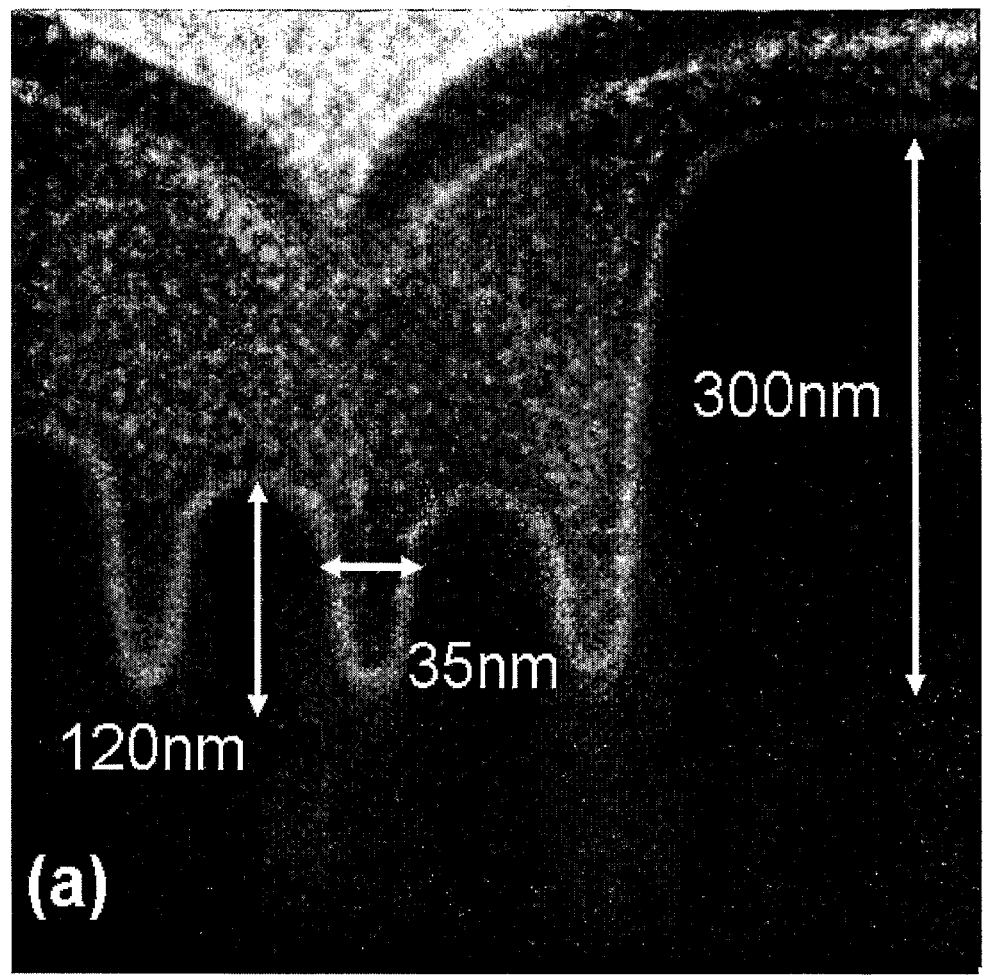
FIG. 5(a) shows a scanning electron microscopy cross-section image of a 10 nm diameter beam 5 nCb/$\mu m^2$ ion dose milling of a bare semiconductor sample produced as known in the art.

FIG. 5(a) shows a scanning electron microscopy cross-section image of a 10 nm diameter beam 5 nCb/μm2 ion dose milling of a bare semiconductor sample produced as known in the art.

Figure 5B:
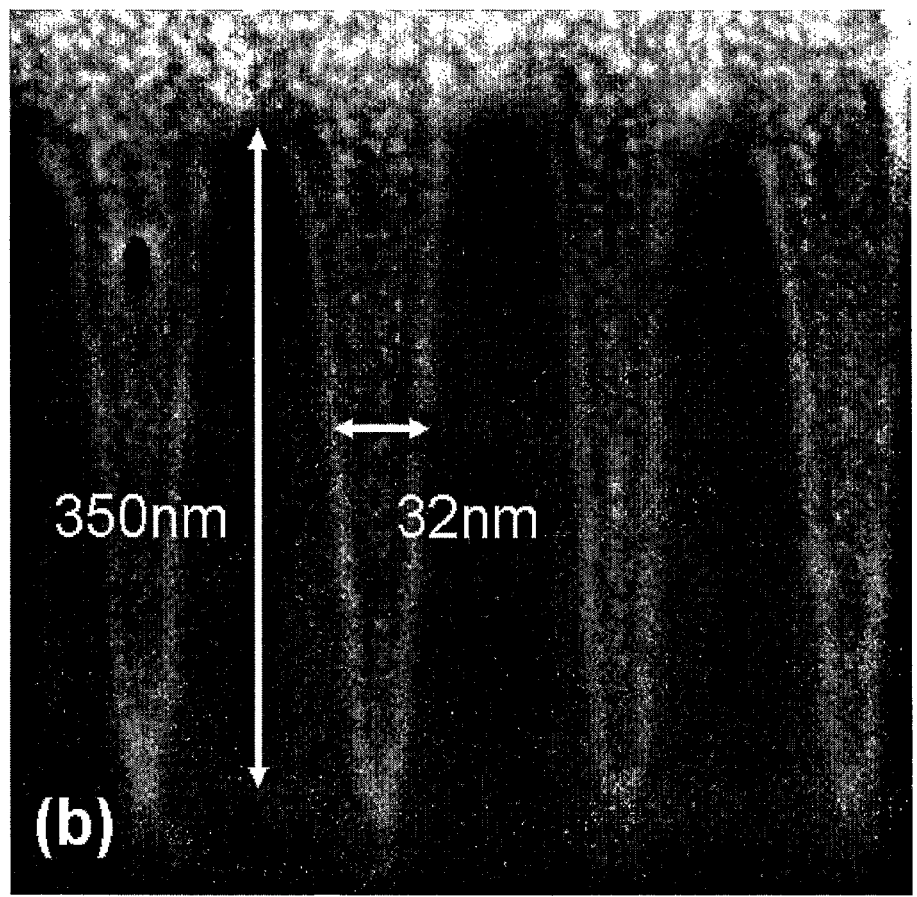
FIG. 5(b) shows a scanning electron microscopy cross-section image of a 10 nm diameter beam 5 nCb/$\mu m^2$ ion dose milling of a 20 nm Ti coated semiconductor sample produced according to the method of the current invention.

FIG. 5(b) shows a scanning electron microscopy cross-section image of a 10 nm diameter beam 5 nCb/μm2 ion dose milling of a 20 nm Ti coated semiconductor sample produced according to the method of the current invention.

Experiments were conducted by the inventors with a Ga+ liquid metal ion source in the FEI Strata 400 FIB system. The system was operated at an acceleration voltage of 30 kV with a beam dwell time of 1 μsec, a 50% overlap and a beam current of 11 pA, corresponding to a beam diameter of 10 nm. The samples consisted of $Ga_{0.45}In_{0.55}P$ and $(Al_{0.5}Ga_{0.5})_{0.51}In_{0.49}P$ layers epitaxially grown on a GaAs substrate. GaAs based materials have been shown to react to have very fast FIB sputter rates and low aspect ratios. The protective Ti layer appeared to improve significantly the patterning resolution in these experiments allowing very high aspect ratio features as small as 30 nm.

In these experiments, the Ti protective layer was deposited outside the FIB system over the whole sample.

The depth was measured by a Scanning Electron Microscopy (SEM) on the cross section cut into the sample for various ion doses.

Different milling conditions were studied for bare semiconductor samples and for samples coated by 10 nm and 20 nm Ti layers. Increasing the ion dose resulted in deeper milling; however it was limited by the damage done to the protective Ti layer. Thicker Ti layer was able to withstand longer milling times and thus larger depths could be reached (FIG. 5).

It was experimentally found that the milling depth is strongly affected by the re-deposition of the sputtered material back into the trench. It is possible that milling the 20 nm Ti layer creates narrow funnels and thus only small fraction of the sputtered material is deposited back into the trench, whereas milling a 10 nm Ti layer creates a wider funnel and more sputtered material is deposited back into the trench limiting the depth.

The effect of re-deposition makes the milling process non-linear with the dose for example we noted, the saturation of depth for 20 nm Ti layer at 350 nm. Thus a calibration of milling rate for a specific combination of: substrate; protective layer thickness and composition; milling parameters; etc may be necessary.

Nonetheless, even for a very thick Ti layer which remained intact during a very long milling time the depth reached saturation and thus an optimal Ti thickness was concluded to be about 20 nm in order to achieve the maximal depth under these ion beam conditions. Using a 20 nm Ti layer with 10 nm ion beam diameter and an ion dose of around 5 $nCb/\mu m^2$ yielded ~30 nm size features with 350 nm depth corresponding to an aspect ratio higher than 10. For comparison, under similar conditions bare semiconductor samples suffered heavy damage and the remaining structures had aspect ratios less than 3.5.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The invention claimed is:

1. A method of focused ion beam deep nano-patterning comprising:
   depositing a protective layer over a semiconductor substrate;
   creating at least one opening in said protective layer by directing a focused ion beam onto said protective layer;
   oxidizing said protective layer before said creating a deep nano-pattern; and
   creating a deep nano-pattern in said substrate by directing a focused ion beam onto said protective layer, wherein sputtering rate by said focused ion beam of said protective layer is slower than said substrate,
   wherein said creating at least one opening in said protective layer and said creating a deep nano-pattern in said substrate are performed using the same focused ion beam technology.

2. The method of focused ion beam deep nano-patterning of claim 1 wherein the protective layer is deposited over a portion of said substrate.

3. The method of focused ion beam deep nano-patterning of claim 2 wherein the protective layer is deposited over a portion of said substrate using ion beam deposition.

4. The method of focused ion beam deep nano-patterning of claim 1 and further comprising removing said protective layer after said creating a deep nano-pattern.

5. The method of focused ion beam deep nano-patterning of claim 1 wherein the substrate is selected from a group comprising: GaAs, GaAlAs, Si, GaP, GaInP, and Ge.

6. The method of focused ion beam deep nano-patterning of claim 1 wherein said substrate is a VLSI electronic circuit.

7. The method of focused ion beam deep nano-patterning of claim 6 wherein said creating a deep nano-pattern in said substrate comprises creating trenches in features of an electronic circuitry within said VLSI.

8. The method of focused ion beam deep nano-patterning of claim 1 wherein aspect ratio of the deep nano-pattern that was created in said substrate is larger than 5.

9. The method of focused ion beam deep nano-patterning of claim 1 wherein aspect ratio of the deep nano-pattern that was created in said substrate is larger than 8.

10. The method of focused ion beam deep nano-patterning of claim 1 wherein aspect ratio of the deep nano-pattern that was created in said substrate is larger than 2 and the width of the deep nano-pattern that was created is smaller than 100 nanometers.

11. The method of focused ion beam deep nano-patterning of claim 1 wherein aspect ratio of the deep nano-pattern that was created in said substrate is larger than 2 and the width of the deep nano-pattern that was created is smaller than 50 nanometers.

12. The method of focused ion beam deep nano-patterning of claim 1 wherein the deep nano-pattern that was created is a repetitive pattern.

13. The method of focused ion beam deep nano-patterning of claim 12 wherein said repetitive pattern is selected from a group comprising: diffraction gratings, Distributed Bragg reflectors, photonic crystals, and surface plasmon devices.

14. A method of focused ion beam deep nano-patterning comprising:
   depositing a protective layer over a semiconductor substrate;
   creating at least one opening in said protective layer by directing a focused ion beam onto said protective layer; and
   creating a deep nano-pattern in said substrate by directing a focused ion beam onto said protective layer,
   wherein sputtering rate by said focused ion beam of said protective layer is slower than said substrate,
   wherein said creating at least one opening in said protective layer and said creating a deep nano-pattern in said substrate are performed using the same focused ion beam technology, and
   wherein the substrate is selected from a group comprising Titanium and Titanium Oxide.

15. A method of focused ion beam deep nano-patterning comprising:
   depositing a protective layer over a semiconductor substrate;
   creating at least one opening in said protective layer by directing a focused ion beam onto said protective layer; and
   creating a deep nano-pattern in said substrate by directing a focused ion beam onto said protective layer, wherein sputtering rate by said focused ion beam of said protective layer is slower than said substrate,
   depositing conductive material in the deep nano-pattern that was created;
   wherein said creating at least one opening in said protective layer and said creating a deep nano-pattern in said substrate are performed using the same focused ion beam technology,
   wherein said substrate is a VLSI electronic circuit,
   wherein said depositing conductive material in the deep nano-pattern that was created comprises creating a new electronic connection between two adjacent features within said VLSI.

16. A method of focused ion beam deep nano-patterning comprising:
   depositing a protective layer over a semiconductor substrate;
   creating at least one opening in said protective layer by directing a focused ion beam onto said protective layer; and
   creating a deep nano-pattern in said substrate by directing a focused ion beam onto said protective layer, wherein sputtering rate by said focused ion beam of said protective layer is slower than said substrate,
   depositing conductive material in the deep nano-pattern that was created;
   wherein said creating at least one opening in said protective layer and said creating a deep nano-pattern in said substrate are performed using the same focused ion beam technology,
   wherein said substrate is a VLSI electronic circuit,
   wherein depositing conductive material in the deep nano-pattern that was created comprises creating electric connection between adjacent features within said VLSI and a test pad on the surface of said substrate.

17. The method of focused ion beam deep nano-patterning of claim 16 and further comprising:
   removing said protective layer after said creating a deep nano-pattern.

18. A method of focused ion beam deep nano-patterning comprising:
   depositing a protective layer over a semiconductor substrate;
   creating a deep nano-pattern in said substrate by directing a focused ion beam onto said protective layer, wherein sputtering rate by said focused ion beam of said protective layer is slower than said substrate; and
   oxidizing said protective layer before said creating a deep nano-pattern.

* * * * *